United States Patent
Ahn et al.

(10) Patent No.: US 9,496,470 B2
(45) Date of Patent: Nov. 15, 2016

(54) CHIP PACKAGE HAVING A LIGHT SHIELD

(71) Applicant: Point Engineering Co., Ltd., Asan-si (KR)

(72) Inventors: Bum Mo Ahn, Suwon-si (KR); Seung Ho Park, Hwaseong-si (KR); Tae Hwan Song, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/986,801

(22) Filed: Jan. 4, 2016

(65) Prior Publication Data

US 2016/0197252 A1  Jul. 7, 2016

(30) Foreign Application Priority Data

Jan. 6, 2015 (KR) .................. 10-2015-0001143

(51) Int. Cl.
*H01L 33/00* (2010.01)
*H01L 33/60* (2010.01)
*H01L 33/48* (2010.01)
*H01L 33/58* (2010.01)

(52) U.S. Cl.
CPC ............ *H01L 33/60* (2013.01); *H01L 33/486* (2013.01); *H01L 33/58* (2013.01)

(58) Field of Classification Search
CPC ...... H01L 33/60; H01L 33/486; H01L 33/58
USPC .......................................... 257/98
See application file for complete search history.

(56) References Cited

U.S. PATENT DOCUMENTS

2013/0194464 A1*  8/2013  Suzuki ............. H01L 31/02325
                                                        348/294

* cited by examiner

*Primary Examiner* — David S Blum
(74) *Attorney, Agent, or Firm* — Sunstein Kann Murphy & Timbers LLP

(57) ABSTRACT

A chip package has a light shield for blocking the light radiated from the chip. The chip package includes: a chip substrate including a conductive portion and at least one insulating portion electrically separating the conductive portion; an optical device mounted on the chip substrate; a sealing portion sealing the upper surface of the chip substrate; an adhesive bonding the sealing portion to the chip substrate; and a light shield formed in the sealing portion and blocking the light of the optical device from entering into the adhesive.

7 Claims, 3 Drawing Sheets

CHIP PACKAGE HAVING A LIGHT SHIELD

CROSS-REFERENCE TO RELATED PATENT APPLICATION

This U.S. non-provisional patent application claims priority under 35 U.S.C. §119 of Korean Patent Application No. 10-2015-0001143 filed on Jan. 6, 2015 in the Korean Patent Office, the entire contents of which are hereby incorporated by reference.

BACKGROUND

1. Technical Field

The present invention relates to a chip package, more particularly, to a chip package having a light shield for blocking the light radiated from the chip.

2. Description of the Related Art

Generally, when mounting an optical device chip such as a UV LED chip, a space is formed to enhance optical reflectivity; then, the chip is mounted inside the space; and the mounting space is sealed with a molded lens, thereby manufacturing a chip package.

At this time, an adhesive (Si etc.) used in sealing with a lens is being exposed to the light radiated from the optical device chip such as a UV LED chip, and due to the lack of tolerance thereto, there has been a problem that the reliability of the package is being degraded since the sealant is denaturalized or hardened as time elapses.

SUMMARY

A chip package in accordance with embodiments of the invention has a light shield for preventing an adhesive from being exposed to the light radiated from the optical device.

More particularly, the light shield may be located in a portion of the sealing member for preventing an adhesive from being exposed to the light being radiated from the optical device.

In accordance with an embodiment of the invention, a chip package includes: a chip substrate comprising a conductive portion and at least one insulating portion electrically separating the conductive portion; an optical device mounted on the chip substrate; a sealing portion sealing the upper surface of the chip substrate; an adhesive bonding the sealing portion to the chip substrate; and a light shield formed in the sealing portion and blocking the light of the optical device from entering into the adhesive.

Preferably, the light shield is being formed between the adhesive and the sealing portion and reflects or absorbs the UV light being radiated from the optical device.

Preferably, the light shield is being formed between the adhesive and the sealing portion and is an optical coating layer comprising alternately deposited material layers having different refractive indexes for reflecting or absorbing the UV light radiating from the optical device.

Preferably, the light shield is being formed on the upper surface of the sealing portion and blocks the light radiated from the optical device and reflected from the outside of the chip package and entering into the adhesive. Such a sealing portion includes a light shield being characterized in that the light shield has a slanted surface with a predetermined angle, and is downwardly protruded, and is being formed along the slanted surface, and reflects or absorbs the UV light radiating from the optical device.

Preferably, the light shield is being formed surrounding the perimeter of the sealing portion and absorbs the light of the optical device.

Preferably, the sealing portion comprises a lens using any one of quartz, $CaF_2$, $MgF_2$, and $BaF_2$.

According to an embodiment of the present invention, an adhesive is deposited into the preformed grooves, and a light shield is additionally formed between the adhesive and the sealing portion so that the exposure from the radiating light of the optical device can be blocked, thus the denaturalization of the adhesive can be prevented and the reliability in bonding process of the lens can be enhanced.

In addition, there is an effect of cost reduction since expensive high-tolerance adhesive 400 may not necessarily be used, and commonly available material can be used as it is; and there is an advantage that low-cost bonding materials commonly available can be applied to expensive UV packages.

DETAILED DESCRIPTION OF EMBODIMENTS

Contents of the description below merely exemplify the principle of the invention. Therefore those of ordinary skill in the art may implement the theory of the invention in various apparatuses which are included within the concept and the scope of the invention even though it is not explained or illustrated in the description. Furthermore, in principle all the conditional terms and embodiments listed in this description are clearly intended for the purpose of understanding the concept of the invention, and one should understand that this invention is not limited to such specially listed exemplary embodiments.

Hereinafter, a preferred exemplary embodiment according to the present invention will be described with reference to the accompanying drawings. For convenience sake, a UV LED will be explained as a chip.

Figure 1:
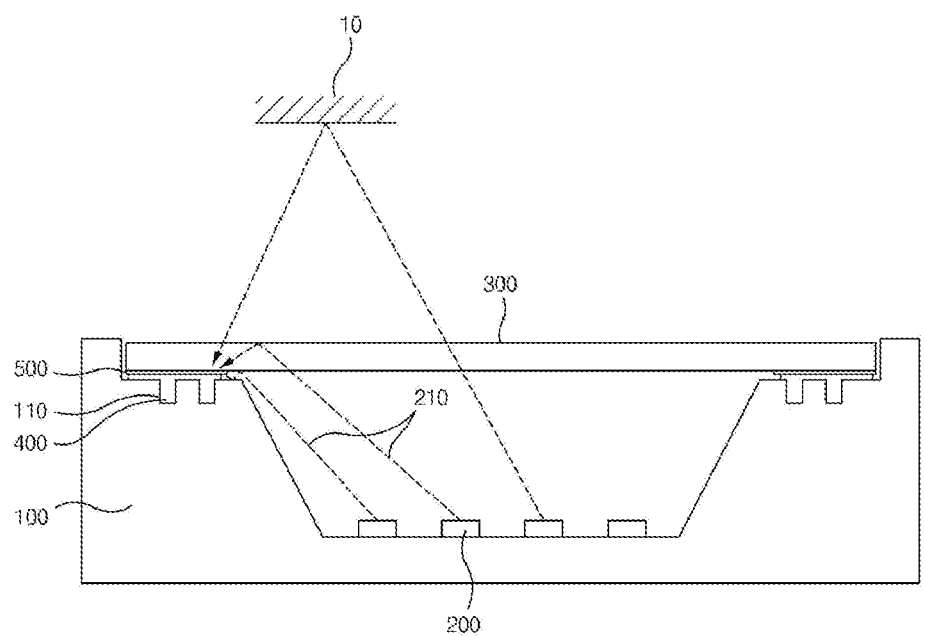
FIG. 1 is a view illustrating a chip package having a light shield according to an exemplary embodiment of the present example.

FIG. 1 is a perspective view illustrating a chip package having a light shield according to an exemplary embodiment of the present example.

Referring to FIG. 1, a chip package having a light shield according to an exemplary embodiment of the present example includes: a chip substrate 100, an optical device 200, a sealing portion 300, an adhesive 400, and a light shield 500.

In the exemplary embodiment of the present invention, the chip substrate may comprise a conductive portion and an insulating portion insulating the conductive layer. The conductive portion applies electrical power to the chip 200 to be mounted. That is, the conductive layer formed with a conductive material in order to apply electrical power to the chip 200, and the lower portion of the conductive layer is being supplied with an electrical power from the outside through bonding with a PCB substrate and the like wherein an electrode is formed. In the exemplary embodiment of the present invention, the conductive portion may be formed using an aluminum sheet material.

The insulating portion electrically separates the conductive portion in order to apply electrical power to each of the electrodes of the chip 200. That is, the conductive portions are being separated in order to form a positive polarity electrode and a negative polarity electrode in the chip 200 respectively, and each of the conductive portions being separated from each other can be respectively supplied with a positive voltage and a negative voltage from the outside.

Further, in the exemplary embodiment of the present invention, the conductive portions may be multiply formed in order to apply electrical power to at least more than two chips.

In addition, in the exemplary embodiment of the present invention, the insulating portions are multiply formed in order to separate multiple conductive portions. In other words, referring to FIG. 1, in a single unit substrate 100, two insulating portions may be formed between three conductive portions.

In the exemplary embodiment of the present invention, the insulating portions can be made of insulating film of synthetic resin material. In this case, the conductive portions and the insulating portions are being bonded using a liquid adhesive and the like with the adhesive film of synthetic resin material in order to enhance bonding strength when bonding the conductive portion and the insulating portion. At this time, for enhancing the bonding strength further, the bonding process may be performed in a high temperature and pressure chamber capable of maintaining a higher temperature and pressure than the ambient temperature and pressure, and besides, the bonding process may be performed after producing a roughness on the joining surface using a mechanical method or a chemical method.

That is, in the exemplary embodiment of the present invention, after anodizing at least one surface of the conductive portion, preferably the surface facing the insulating portion, the conductive portion and the insulating portion can be bonded via the anodized surface. In other words, when the conductive portion is comprised of aluminum material, in order to enhance the bonding strength, each of the bonding surfaces thereof can be anodized prior to the bonding process, and the above mentioned roughness can be produced on the surfaces anodized in such a way.

Further, in the exemplary embodiment of the present invention, when the conductive portion is an aluminum substrate 100, the surface of the conductive portion which will be facing the insulating portion is being anodized first, and then the insulating portion may be formed via the bonding process thereof.

Next, in the exemplary embodiment of the present invention, the chip package having a light shield is provided with a concave cavity towards the inner side of the conductive portion in order to form a mounting space for the chip 200. Referring to FIG. 1, the surface of the substrate 100 whereon the chip 200 is mounted is formed to be a concave shape further recessed with respect to the flat outer surface. That is, the chip 100 has a shape wherein an outer wall is formed along the perimeter of the area wherein the chip 200 is being mounted.

That is, in the exemplary embodiment of the present invention, the chip is mounted on the conductive portion in the space formed inside the cavity, and the chip package can be manufactured by sealing the cavity with a lens and the like after mounting the chip.

In the exemplary embodiment of the present invention, the sealing portion 300 seals the upper surface of the chip substrate.

The sealing portion 300 may vary depending on the types of the chip, for example, quartz can be used for a UV-C package, and glass can be used for a UV-B and a UV-A packages. In addition, a lens can be made using $CaF_2$, $MgF_2$, and $BaF_2$ as a material for the lens. The adhesive 400 bonds the sealing portion and the chip substrate 100. Silicon and the like may be used as an adhesive 400.

In addition, in the exemplary embodiment of the present invention, the chip substrate 100 may further include a groove 110.

Referring to FIG. 1, the groove 110 according to an exemplary embodiment of the present invention is formed to have a predetermined depth and outwardly spaced apart from the cavity.

In the exemplary embodiment of the present invention, preferably, the groove 110 is continuously formed along the cavity. That is, the bonding strength between the sealing portion 300 and the chip substrate 110 can be further increased by continuously forming the groove so as to enlarge the contact area with the sealing portion 300 for sealing the chip package when manufacturing thereof. In addition, since the groove is formed continuously, it is advantageous in that the adhesive 400 can be injected through a single-injection process when injecting the adhesive 400 into the groove 110.

However, considering the forming process of the groove 110, of course the groove can be formed in two separate grooves 110 as shown in FIG. 1.

That is, according to the exemplary embodiment of the present invention, an adhesive is injected into the space comprising a predetermined groove at the contact surface where the sealing portion 300 is in contact with, and then the sealing portion 300 is bonded. At this time, since the adhesive being used for bonding of the sealing portion 300 can be overflowed around the bonding area, an additional groove may be provided in the bonding surface with the sealing portion 300 in order to prevent this overflow and for using a right amount of adhesive.

In the exemplary embodiment of the present invention, the light shield 500 is formed in the sealing portion and blocks the light of the optical device 200 from entering into the adhesive.

Figure 2:
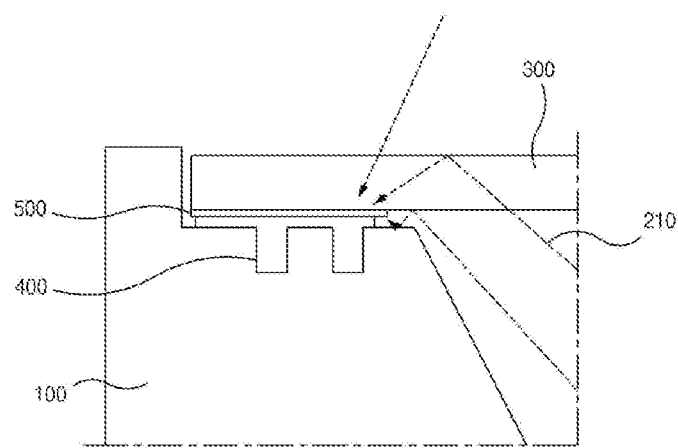
FIG. 2 is a more detailed view illustrating a chip package having a light shield according to an exemplary embodiment of the present example.

Hereinafter, the sealing portion 300 of the chip package having a light shield 500 according to an exemplary embodiment of the present invention will be described. FIG. 2 is an enlarged view illustrating a sealing portion 300 of a chip package having a light shield 500 according to FIG. 1.

The sealing portion 300 according to the exemplary embodiment of the present invention further includes a light shield 500.

In the exemplary embodiment of the present invention, the light shield 500 is formed in one surface of the sealing portion 300 so as to correspond to the groove 110 which is concavely formed outside of the cavity with a predetermined depth and spaced apart from the cavity.

'One surface of the sealing portion 300' may be the one formed in the lower surface of the sealing portion and formed between the adhesive 400 of the substrate and the lower surface of the sealing portion as shown in FIG. 2.

In the exemplary embodiment of the present invention, the light shield 500 can be a metal layer formed between the adhesive 400 and the sealing portion 300 and reflecting or absorbing the UV light 210 radiated from the optical device 200.

More particularly, the light shield may be formed in the lower surface of the sealing portion through deposition or coating for a thickness having a transmission coefficient (that is, 1—refection coefficient—absorption coefficient) of less than 5% in UV region. PVD (Thermal Evaporation, E-Beam Evaporation, Sputtering, etc.), CVD, and like may be used as a metal deposition method for the metal layer. Besides, Cr, Ti, Ni, and the like may be used as an adhesive layer during deposition in order to enhance the bonding strength, and a paste of a metal-organic binder mixture can be printed when using a coating layer.

In addition, in the exemplary embodiment of the present invention, the light shield 500 may be an optical coating layer formed by alternately depositing the material layers having different refractive indexes from each other and being formed between the adhesive 400 and the sealing portion 300 and reflects or absorbs the UV light being radiated from the optical device 200.

That is, a lower refractive index material and a higher refractive index material are alternately deposited, and $SiO_2$ may be used as a lower refractive index material and $TiO_2$, $Ta_2O_5$, $N_bO_2$, and the like may be used as a higher refractive index material.

At this time, E-beam evaporation or reactive sputtering can be used as a deposition method, and preferably, thickness of each layer and the number of layer are designed in a way that maximum reflection is achieved in the corresponding UV region. Generally, the transmission coefficient is designed to be less than 3%.

In addition, the exemplary embodiment of the present invention, preferably the width of the light shield 500 is formed to cover the width of the adhesive 400 being disposed in the groove 110.

That is, when the thickness of the sealing portion 220 is thinner than the width of the adhesive 400, entering of the light 210, which is reflected from the surface of the sealing portion 300, into the adhesive cannot be blocked as shown in FIG. 2.

Hereinafter, by referring to FIG. 3, the sealing portion 300 of the chip package having a light shield 500 according to another exemplary embodiment of the present invention will be described.

Figure 3:
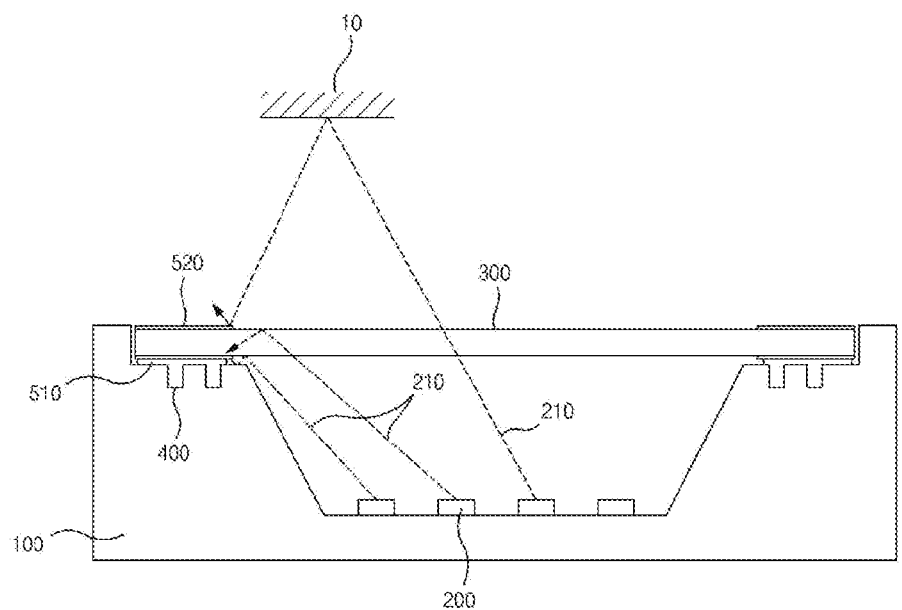
FIG. 3 is a view illustrating a chip package having a light shield according to another exemplary embodiment of the present example.

Referring to FIG. 3, the chip package according to an exemplary embodiment of the present example may further include a light shield 500 in the upper surface of the sealing portion 300. That is, let the light shield 500 being formed in the lower surface of the sealing portion according to the above mentioned exemplary embodiment be a first light shield 510, and a second light shield 520 can be additionally formed in the upper surface of the sealing portion.

Thus, the second light shield 520 according to the exemplary embodiment of the present invention is formed in the upper surface of the sealing portion so that entering of the light 210, which is radiated from the optical device 200 and reflected from the external object 10 outside the chip package, into the adhesive can be prevented.

Hereinafter, by referring to FIG. 4, the sealing portion 300 of the chip package having a light shield 500 according to yet another exemplary embodiment of the present invention will be described.

Figure 4:
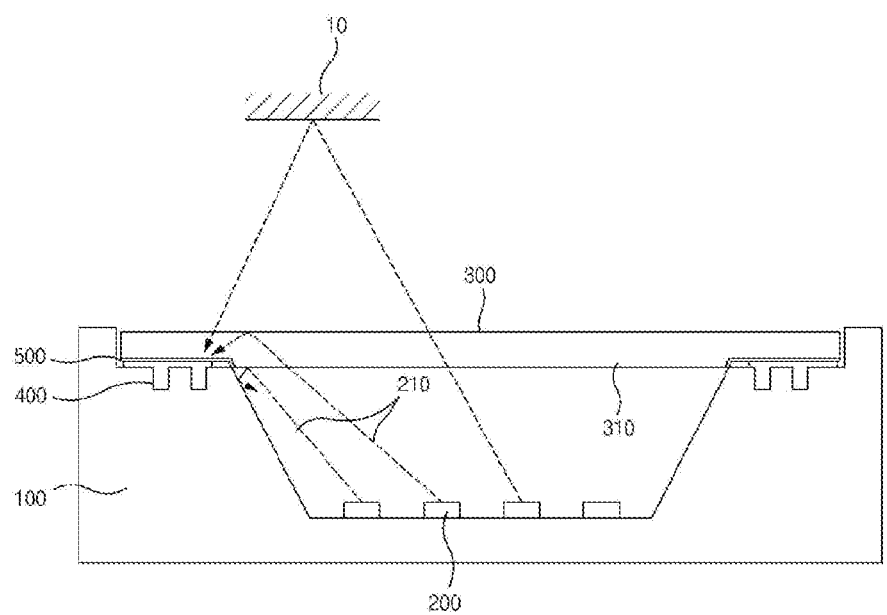
FIG. 4 is a view illustrating a chip package having a light shield according to yet another exemplary embodiment of the present example.

Referring to FIG. 4, the sealing portion 300 according to the exemplary embodiment of the present invention is provided with an inclined surface having a predetermined angle and downwardly protruded, and the light shield 500 may be formed between the adhesive 400 and the sealing portion 300 along the inclined surface.

That is, the shape of the sealing portion 300 is machined to have an inclined surface and to be protruded, and then the light shield 500 is continuously formed up to such an inclined surface, thus, blocking of the light 210 leaking through the gap between the sealing portion 300 and the chip substrate 100 becomes possible, as shown in FIGS. 1 to 3.

Figure 5:
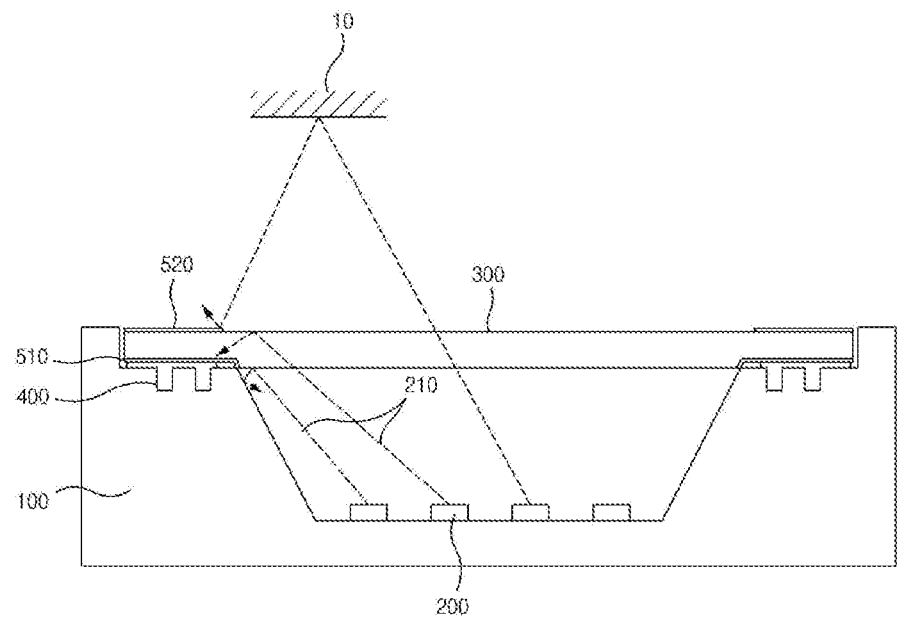
FIG. 5 is a view illustrating a chip package having a light shield according to still yet another exemplary embodiment of the present example.

Further, referring to FIG. 5, as another exemplary embodiment, let the light shield 500 according to FIG. 4 be the first light shield 510, and then adding a second light shield 520 according to FIG. 3 becomes also possible.

Thus, the first light shield 510 is continuously formed up to the inclined surface of the sealing portion 300 and blocks the light 210 leaking through the gap between the sealing portion 300 and the chip substrate 100 as shown in FIGS. 1 to 3; and the second light shield 520 is formed in the upper surface of the sealing portion 300 and may prevent entering of the light 210, which is radiated from the optical device 200 and reflected from the external object 10 outside the chip package, into the adhesive.

Figure 6:
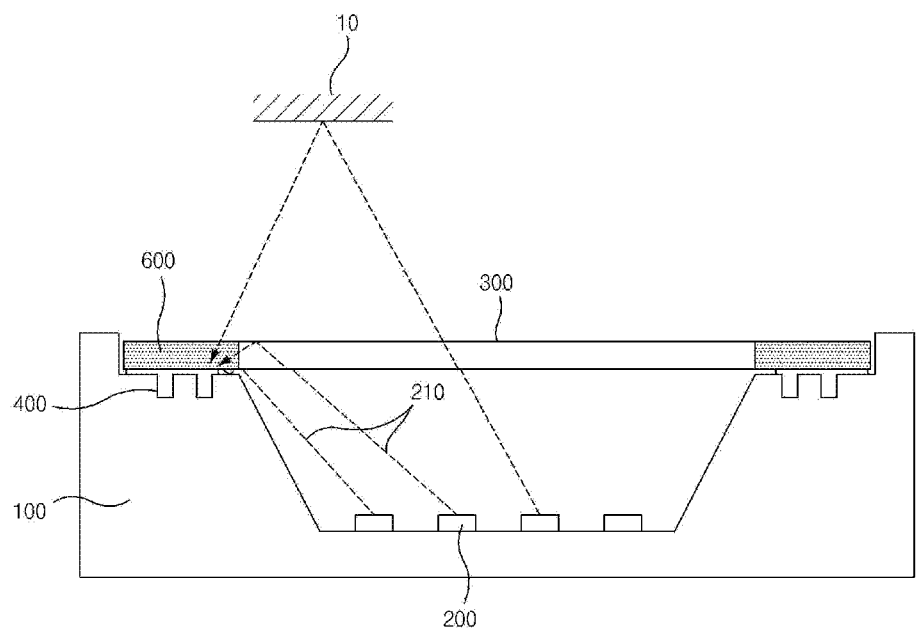
FIG. 6 is a view illustrating a chip package having a light shield according to still yet still another exemplary embodiment of the present example.

In addition, referring to FIG. 6, the sealing portion 300 of a chip package having a light shield according to another exemplary embodiment of the present invention may include a light shield 600 which is formed surrounding the perimeter of the sealing portion 300 and comprising an absorption portion which absorbs the light 210 of the optical device 200.

That is, after partially forming the light shield 600 in glass or quartz with a UV absorbing portion using a metal ion doping process, this can be bonded to the perimeter of the sealing portion 300. At this time, such as copper, indium, and the like can be used as metal ion; and it is preferred that ion doping is performed so that the transmission coefficient (that is, 1—refection coefficient—absorption coefficient) in the UV region is less than 10% eventually.

By forming a light shield in the sealing portion 300 so that the exposure of the adhesive 400 by the radiating light of the optical device 200 can be blocked, denaturalization of the adhesive 400 can be prevented and the reliability in bonding process of the sealing portion (lens) can be enhanced.

In addition, there is an effect of cost reduction since expensive high-tolerance adhesive 400 may not necessarily be used, and commonly available material can be used as it is; and there is an advantage that low-cost bonding materials commonly available can be applied to expensive UV packages.

Above description is merely an exemplary description of the technical spirit of the present invention, and various modifications, changes, and substitutions are possible for a person of skill in the art within the scope without deviating from the fundamental characteristics of the present invention.

Therefore, the exemplary embodiment and the accompanying drawings disclosed in the present invention is for explanation and not for limiting the technical spirit of the present invention, and the scope of the technical spirit of the present invention is not limited by these exemplary embodiments and the accompanying drawings. The scope of protection of the present invention must be interpreted according to the following claims, and it must be interpreted in such a way that all the technical spirits within the equivalent scope of the present invention are included in the scope of the rights of the present invention.

What is claimed is:

1. A chip package having a light shield comprising:
    a chip substrate comprising a conductive portion and at least one insulating portion electrically separating said conductive portion;
    an optical device mounted on said chip substrate;
    a sealing portion sealing the upper surface of said chip substrate;
    an adhesive bonding said sealing portion to said chip substrate; and
    a light shield formed in said sealing portion and blocking the light of said optical device from entering into said adhesive.

2. The chip package having a light shield according to claim 1, wherein
    said light shield is being formed between said adhesive and said sealing portion and reflects or absorbs the UV light being radiated from said optical device.

3. The chip package having a light shield according to claim 1, wherein
    said light shield is being formed between said adhesive and said sealing portion and is an optical coating layer comprising alternately deposited material layers having different refractive indexes for reflecting or absorbing the UV light radiating from said optical device.

4. The chip package having a light shield according to claim 1, wherein
    said light shield is being formed on the upper surface of said sealing portion and blocks the light radiated from said optical device and reflected from the outside of said chip package and entering into said adhesive.

5. The chip package having a light shield according to claim 1, wherein
    said light shield has a slanted surface with a predetermined angle, and is downwardly protruded, and is being formed along the slanted surface, and reflects or absorbs the UV light radiating from said optical device.

6. The chip package having a light shield according to claim 1, wherein
    said light shield is being formed surrounding the perimeter of said sealing portion and absorbs the light of said optical device.

7. The chip package having a light shield according to claim 1, wherein
    said sealing portion comprises a lens using any one of quartz, $CaF_2$, $MgF_2$, and $BaF_2$.

* * * * *